(12) United States Patent
Schaller et al.

(10) Patent No.: US 11,315,806 B2
(45) Date of Patent: Apr. 26, 2022

(54) BATCH HEATING AND COOLING CHAMBER OR LOADLOCK

(71) Applicant: Applied Materials, Inc., Santa Clara, CA (US)

(72) Inventors: Jason M. Schaller, Austin, TX (US); Robert Brent Vopat, Austin, TX (US); Paul E. Pergande, Austin, TX (US); Benjamin B. Riordon, Newburyport, MA (US); David Blahnik, Round Rock, TX (US); William T. Weaver, Austin, TX (US)

(73) Assignee: Applied Materials, Inc., Santa Clara, CA (US)

(*) Notice: Subject to any disclaimer, the term of this patent is extended or adjusted under 35 U.S.C. 154(b) by 264 days.

(21) Appl. No.: 16/400,516

(22) Filed: May 1, 2019

(65) Prior Publication Data
US 2019/0259638 A1    Aug. 22, 2019

Related U.S. Application Data

(62) Division of application No. 15/001,716, filed on Jan. 20, 2016, now Pat. No. 10,283,379.

(60) Provisional application No. 62/106,568, filed on Jan. 22, 2015.

(51) Int. Cl.
| | | |
|---|---|---|
| *H01L 21/00* | (2006.01) | |
| *H01L 21/67* | (2006.01) | |
| *H01L 21/673* | (2006.01) | |
| *H01L 21/687* | (2006.01) | |

(52) U.S. Cl.
CPC .... *H01L 21/67017* (2013.01); *H01L 21/6732* (2013.01); *H01L 21/67109* (2013.01); *H01L 21/68742* (2013.01)

(58) Field of Classification Search
CPC ......... H01L 21/67017; H01L 21/67109; H01L 21/6732; H01L 21/68742; H01L 21/67115; H01L 21/67178
See application file for complete search history.

(56) References Cited

U.S. PATENT DOCUMENTS

| | | | | |
|---|---|---|---|---|
| 4,558,660 A | * | 12/1985 | Nishizawa | C30B 25/105 118/50.1 |
| 4,571,486 A | * | 2/1986 | Arai | B28D 5/00 257/E21.349 |
| 5,059,770 A | * | 10/1991 | Mahawili | H01L 23/345 219/391 |
| 5,508,495 A | * | 4/1996 | Yahav | H05B 3/68 219/466.1 |
| 5,674,786 A | | 10/1997 | Turner et al. | |

(Continued)

FOREIGN PATENT DOCUMENTS

| | | |
|---|---|---|
| CN | 202003971 U | 10/2011 |
| CN | 103201828 A | 7/2013 |

(Continued)

*Primary Examiner* — Travis Ruby
(74) *Attorney, Agent, or Firm* — Servilla Whitney LLC

(57) ABSTRACT

Wafer cassettes and methods of use that provide heating a cooling to a plurality of wafers to decrease time between wafer switching in a processing chamber. Wafers are supported on a wafer lift which can move all wafers together or on independent lift pins which can move individual wafers for heating and cooling.

7 Claims, 4 Drawing Sheets

(56) References Cited

U.S. PATENT DOCUMENTS

| | | | | |
|---|---|---|---|---|
| 5,689,614 | A * | 11/1997 | Gronet | C23C 16/481 118/725 |
| 5,751,003 | A * | 5/1998 | Rose | H01J 27/14 250/492.21 |
| 5,850,071 | A * | 12/1998 | Makiguchi | H01L 21/67109 219/390 |
| 5,902,088 | A | 5/1999 | Fairbairn et al. | |
| 5,944,857 | A | 8/1999 | Edwards et al. | |
| 6,042,623 | A * | 3/2000 | Edwards | H01L 21/67751 29/25.01 |
| 6,072,163 | A * | 6/2000 | Armstrong | H01L 21/67103 219/497 |
| 6,235,656 | B1 | 5/2001 | Clarke | |
| 6,292,250 | B1 * | 9/2001 | Matsuyama | H01L 21/67178 118/52 |
| 6,562,141 | B2 | 5/2003 | Clarke | |
| 6,576,873 | B1 * | 6/2003 | Choi | G03F 7/70991 219/390 |
| 6,633,022 | B2 * | 10/2003 | Kitano | H01L 21/67248 118/50.1 |
| 6,753,508 | B2 * | 6/2004 | Shirakawa | H01L 21/67109 219/390 |
| 6,776,849 | B2 * | 8/2004 | Aggarwal | C23C 16/4584 118/500 |
| 6,825,447 | B2 * | 11/2004 | Kim | H01L 21/67109 118/50.1 |
| 6,842,582 | B2 * | 1/2005 | Morimoto | H05B 3/0047 118/50.1 |
| 7,604,306 | B1 * | 10/2009 | Cheng | B62B 3/04 312/249.8 |
| 7,978,963 | B2 * | 7/2011 | Shimizu | H01L 21/324 392/411 |
| 8,107,801 | B2 * | 1/2012 | Shimizu | H01L 21/67115 392/418 |
| 8,288,288 | B1 | 10/2012 | Gage et al. | |
| 8,314,408 | B2 * | 11/2012 | Hartsuiker | B05D 3/067 250/492.1 |
| 8,963,050 | B2 * | 2/2015 | Kato | F27D 7/02 219/385 |
| 9,287,148 | B1 * | 3/2016 | Evans | H01L 21/6776 |
| 9,685,303 | B2 * | 6/2017 | Evans | H01J 37/20 |
| 2001/0000098 | A1 * | 4/2001 | Fayfield | H01L 21/02046 156/345.5 |
| 2001/0010309 | A1 * | 8/2001 | Van Bilsen | H01L 21/67115 219/497 |
| 2002/0000521 | A1 * | 1/2002 | Brown | H01L 21/6833 250/492.1 |
| 2002/0017377 | A1 | 2/2002 | Koguchi et al. | |
| 2002/0086260 | A1 * | 7/2002 | Shang | H01L 21/67109 432/247 |
| 2002/0104205 | A1 * | 8/2002 | Goodwin | H01L 21/67115 29/25.01 |
| 2002/0186967 | A1 * | 12/2002 | Ramanan | H01L 21/67103 392/418 |
| 2003/0049372 | A1 * | 3/2003 | Cook | H01L 21/67017 427/248.1 |
| 2003/0132213 | A1 * | 7/2003 | Kim | H01L 21/67109 219/390 |
| 2003/0194299 | A1 | 10/2003 | Yoo | |
| 2004/0040508 | A1 * | 3/2004 | Shajii | C23C 16/463 118/724 |
| 2004/0069448 | A1 * | 4/2004 | Suenaga | F24D 3/02 165/47 |
| 2004/0096300 | A1 | 5/2004 | Perlov et al. | |
| 2004/0226513 | A1 * | 11/2004 | Inagawa | H01L 21/67109 118/724 |
| 2006/0045668 | A1 * | 3/2006 | Grabowski | H01L 21/67201 414/217 |
| 2006/0051077 | A1 * | 3/2006 | Kubo | H01L 21/67248 392/416 |
| 2006/0127067 | A1 * | 6/2006 | Wintenberger | H01L 21/67109 392/416 |
| 2006/0182530 | A1 | 8/2006 | Wang | |
| 2007/0029740 | A1 * | 2/2007 | Natsuhara | H01L 21/67109 279/3 |
| 2007/0267188 | A1 * | 11/2007 | Di Stefano | G05D 23/1393 165/296 |
| 2008/0107508 | A1 * | 5/2008 | Chan | H01L 21/67781 414/217.1 |
| 2008/0187299 | A1 * | 8/2008 | Shimizu | H01L 21/67115 392/418 |
| 2008/0226272 | A1 * | 9/2008 | Kasai | H01L 21/2686 392/418 |
| 2009/0000769 | A1 * | 1/2009 | Lin | H01L 21/67248 165/80.4 |
| 2009/0016853 | A1 * | 1/2009 | Yoo | H01L 21/67766 414/147 |
| 2009/0142167 | A1 * | 6/2009 | Gage | H01L 21/67742 414/221 |
| 2009/0212014 | A1 * | 8/2009 | Ohata | H01L 21/67781 216/58 |
| 2011/0036709 | A1 * | 2/2011 | Hawrylchak | C23C 14/34 204/298.11 |
| 2011/0259840 | A1 * | 10/2011 | Park | H01L 21/6732 211/41.18 |
| 2011/0308458 | A1 * | 12/2011 | Sung | H01L 21/67742 118/719 |
| 2012/0091110 | A1 * | 4/2012 | Kaneyama | H01L 21/67115 219/201 |
| 2012/0127376 | A1 * | 5/2012 | Shikina | H01L 51/5284 348/800 |
| 2012/0231628 | A1 * | 9/2012 | Lee | C23C 16/44 438/694 |
| 2013/0052834 | A1 * | 2/2013 | Kielwein | H01L 21/67115 438/758 |
| 2013/0126509 | A1 * | 5/2013 | He | H01L 21/67248 219/209 |
| 2013/0168353 | A1 * | 7/2013 | Okita | H01L 21/67069 216/67 |
| 2013/0183831 | A1 * | 7/2013 | Yu | H01L 21/67115 438/758 |
| 2013/0280925 | A1 * | 10/2013 | Ota | H01L 21/67178 438/799 |
| 2013/0312658 | A1 * | 11/2013 | Kashiyama | H01L 21/67167 118/58 |
| 2014/0034138 | A1 * | 2/2014 | Lee | F17D 1/04 137/1 |
| 2014/0087073 | A1 * | 3/2014 | Ivanov | H01L 21/67017 427/248.1 |
| 2014/0230728 | A1 * | 8/2014 | Kajihara | C23C 16/4582 118/719 |
| 2014/0263271 | A1 * | 9/2014 | Sheelavant | H01L 21/67115 219/443.1 |
| 2014/0270731 | A1 * | 9/2014 | Gerling | H01L 21/67115 392/408 |
| 2015/0287624 | A1 * | 10/2015 | Hatano | H01L 21/67745 414/222.13 |
| 2016/0279651 | A1 * | 9/2016 | Miyagi | H01L 21/67115 |
| 2016/0329458 | A1 * | 11/2016 | Evans | H01L 21/68 |
| 2016/0379853 | A1 * | 12/2016 | Schaller | H01L 21/67115 361/234 |
| 2019/0259638 | A1 * | 8/2019 | Schaller | H01L 21/68742 |

FOREIGN PATENT DOCUMENTS

| | | |
|---|---|---|
| WO | 02/05332 A2 | 1/2002 |
| WO | 2013/173999 A1 | 11/2013 |

* cited by examiner

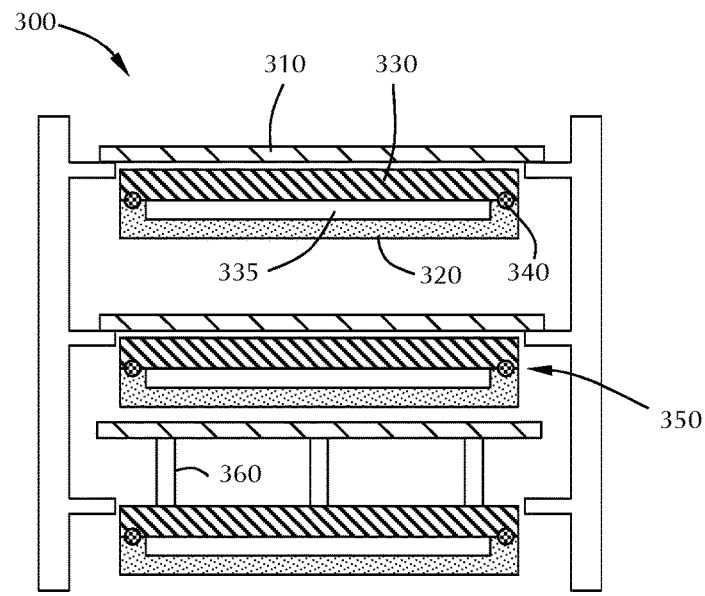
FIG. 3
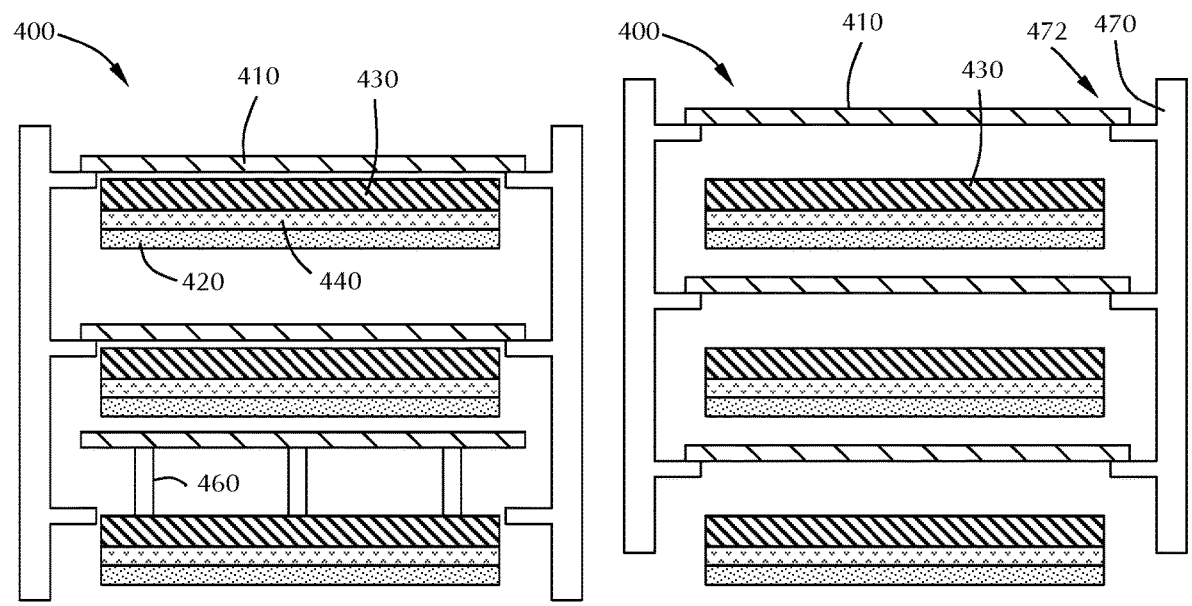
FIG. 4
FIG. 5

BATCH HEATING AND COOLING CHAMBER OR LOADLOCK

CROSS-REFERENCE TO RELATED APPLICATIONS

This application is a divisional of U.S. application Ser. No. 15/001,716, filed Jan. 20, 2016, which claims priority to U.S. Provisional Application No. 62/106,568, filed Jan. 22, 2015, the entire contents of which are hereby incorporated by reference herein.

FIELD

Embodiments of the present disclosure generally relate to an apparatus for processing substrates. More particularly, the disclosure relates to apparatus and methods for heating and cooling wafers for batch processing.

BACKGROUND

The process of forming semiconductor devices is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for ALD processes and some chemical vapor deposition (CVD) processes.

The ALD platform has a wide range of applications with various requirements and constraints that demands a flexible architecture. Platform requirements include wafer preheating, post cooling, preheat & post cool, throughput from 30 wph (wafers per hour) to 270 wph, high vacuum loadlocks, and numerous other specifications can be a challenge to provide the functionality with low entitlement cost.

ALD batch processing platforms provides standard and active wafer cooling capable loadlocks. The high temperature processes (>450° C.) benefit from wafer preheating prior to being placed on the process chamber susceptor. Currently, room temperature wafers are preheated in the process chamber for as long as 3 minutes. This costs valuable processing time and significantly reduce system throughput for shorter processes.

Current ALD processors have numerous methods to heat and cool single wafers in a loadlock. However, the ALD batch processing platforms can process batches with six wafers or more. Single wafer loadlock cycles are too slow (36 seconds) to the meet the 15 second exchange budget. Therefore, there is a need in the art for apparatus and methods for preheating and post-cooling batches of wafers for batch processing.

SUMMARY

One or more embodiments of the disclosure are directed to wafer cassettes comprising a wall supporting a plurality of cold plates. The wall allows access to a front side of at least some of the cold plates. A plurality of LED lamps are positioned against a back side of the cold plates and have a front side spaced from a front side of an adjacent cold plate to form a gap. The plurality of LED lamps is directed toward the front side of the adjacent cold plate. A wafer lift is positioned to support a periphery of a wafer.

Additional embodiments of the disclosure are directed to wafer cassettes comprising a wall supporting a plurality of cold plates. The wall allows access to a front side of at least some of the cold plates so that a wafer can be positioned adjacent the front side of the cold plates. A reflector is adjacent a back side of at least some of the cold plates. The reflector is separated from the back side of the cold plate by at least one thermal break. A heater is adjacent a back side of the reflector. The heater is separated from the back side of the reflector by at least one thermal break so that there is a gap between a back side of the heater and the front side of an adjacent cold plate. A plurality of lift pins is positioned within the cold plate.

Further embodiments of the disclosure are directed to wafer cassettes comprising a wall supporting a plurality of cold plates. The wall allows access to a front side of at least some of the cold plates so that a wafer can be positioned adjacent the front side of the cold plates. A heater is on a back side of the cold plate so that a back side of the heater is spaced from the front side of an adjacent cold plate to form a gap. An insulator is between the heater and the cold plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a cross-sectional view of a wafer cassette according to one or more embodiment of the disclosure;

FIG. 4 is a cross-sectional view of a wafer cassette according to one or more embodiment of the disclosure;

FIG. 5 is a cross-sectional view of a wafer cassette according to one or more embodiment of the disclosure;

DETAILED DESCRIPTION

Embodiments of the disclosure are directed to apparatus and methods for preheating and/or post-cooling a batch of wafers. As used in this specification and the appended claims, the terms "wafer", "substrate" and the like are used interchangeably. In some embodiments, the wafer is a rigid, discrete substrate, for example, a 200 mm or 300 mm silicon wafer.

Embodiments of the disclosure provide apparatus to preheat and post cool batches of wafers. While most of the embodiments described related to six wafer batch loadlocks, those skilled in the art will understand that the number of wafers handled in a batch can be greater than or less than six. Embodiments of the disclosure provide apparatus that can preheat during the loadlock pump down and post-cooling during the loadlock vent to atmosphere. This allows for parallel processing and limited impact to throughput of the system. Embodiments are also easily retrofitable for existing system in the field. These configurations are discussed in the context of a loadlock design for ALD but, could be applicable to any batch heating and/or cooling application. Batch heating has remained a challenge due to the stacking of heating elements, ramp rate, maximum temperature and cost of components.

One aspect of the disclosure utilizes LED heating with a dual function cold pedestal. LED heating technology is an ultra-thin lamp heating package that could easily be stacked in a cassette configuration. LED heating technology is efficient, can be instantly turned off and has very little thermal mass enabling the LEDs to cool relatively quickly compared to a traditional resistive heater.

The LED lamp heaters may benefit from active cooling which can remove the 40% of energy that is converted to heat by the LEDs. In some embodiments, LEDs and circuits are assemblies directly to the back of a metal substrate with channels for cooling water that acts as a heat exchange to remove excess heat. The other side of the heat exchanger is the wafer cooling surface when the lamps are off and contains the traditional cooling plate standoff bump pattern and features.

Figure 1:
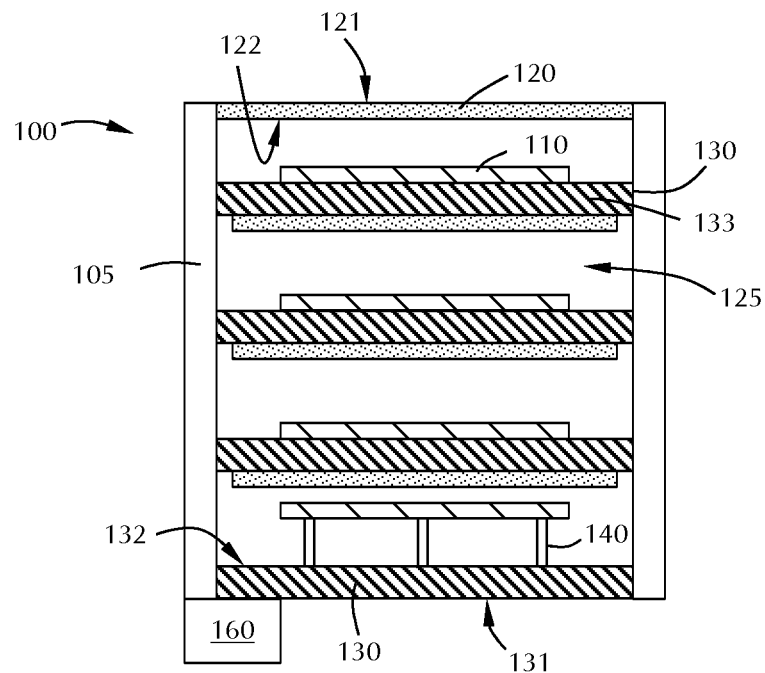
FIG. 1 is a cross-sectional view of a wafer cassette according to one or more embodiment of the disclosure.

FIG. 1 shows a first aspect of the disclosure incorporating LEDs and cooling. Embodiments of the disclosure can be incorporated into a wafer cassette or retrofit into a loadlock chamber. FIG. 1 shows a cassette 100 with four wafers 110. This is merely representative of one possible configuration and should not be taken as limiting the scope of the disclosure. Some embodiments can support two, three, four, five, six, seven, eight, nine wafers or more.

The cassette 100 has at least one wall 105. In the embodiment of FIG. 1, the cassette 100 has two walls 105. Some embodiments have more than two walls. The walls 105 support a plurality of cold plates 130, each cold plate 130 having a front side 132 and a back side 131. The cold plates 130 can be connected directly to the walls 105, as shown in FIG. 1, or positioned on a holder. The walls 105 allow access to the front side of the cold plates 130. As used in this regard, allowing access means that there is sufficient space for a wafer to be positioned adjacent the front side 132 of the cold plate 130.

A plurality of LED lamps 120 are positioned so that the back side 121 of the LED lamps 120 is in contact with the back side 131 of the cold plates 130. The front side 122 of the LED lamps 120 are spaced a distance from the front side 132 of an adjacent cold plate 130 forming a gap 125 between. As used in this regard, the term "adjacent cold plate" means a cold plate other than the cold plate in contact with the LED lamps. The plurality of LED lamps 120 are positioned to direct light toward the front side 132 of the adjacent cold plate 130, so that if a wafer 110 were positioned in the gap 125, the light would be directed toward the wafer 110.

The cold plates 130 of some embodiments have at least one fluid channel extending through the body 133 of the cold plate 130. In some embodiments, the wall includes a supply manifold and/or a return manifold in fluid communication with the channels in the cold plate. As will be described in greater detail, this allows for a flow of fluid through the channels to cool to the cold plate 130. The supply manifold and/or return manifold can be an integral part of the wall 105 or can be connected to the wall. The cold plates 130 are also referred to as pedestals.

An LED lamp 120 and cold plate 130 have a combined thickness less than 1 inch and can stack in a batch loadlock. Some embodiments have combined thicknesses less than about 0.5 inches thick. Compared to a typical lamp module which is generally in the range of 4 inches to 8 inches in height, the LEDs occupy less space. The heating efficiency of an LED is higher than that of a standard heating module and the wavelength of the LED light can be selected to maximize heating efficiency. The LEDs can emit light at any wavelength that can be absorbed by the wafers. For example, LEDs emitting light in the UV, visible or NIR wavelengths can be employed. In some embodiments, the LEDs emit light at about 450 nm, or in the range of about 400 nm to about 500 nm, or in the range of about 300 nm to about 600 nm. In some embodiments, the LEDs emit near infrared light having a wavelength of about 1000 nm, or in the range of about 900 nm to about 1100 nm. One or more embodiments use dual band heating with NIR and visible wavelengths. For example, half of the LED lamps 120 may emit light at 450 nm and half emit light at 1000 nm. During the heating process, the NIR LEDs can be activated at different times than the visible light LEDs based on the absorption profile of the substrate as a function of temperature.

The LED lamps 120 of some embodiments are made up of an array of individual LEDs. The array can be any suitable size, depending on the size of the wafers being heated. In some embodiments, the LED lamps comprise an array of in the range of about 200 to about 1500 LEDs, or in the range of about 400 to about 1300 LEDs, or in the range of about 600 to about 1100 LEDs or about 900 LEDs. In some embodiments, the array of LED lamps can be controlled in zones so that different portion so of the LED array can have different power output.

In use, wafers 110 are loaded into the cassette 100 and are elevated above the cold plate 130 by lift pins 140. Generally, the lift pins 140 have a length that is sufficient to move the wafer 110 away from the front side 132 of the cold plate 130 by a distance of at least about 50% of the gap 125. For descriptive purposes, FIG. 1 shows lift pins 140 supporting the bottom wafer only. However, those skilled in the art will understand that lift pins 140 can support any or all of the wafers 110. The lift pins 140 can be moved at the same time or independently so that all of the wafer 110 move at the same time or to allow individual control of the wafer 110 movement.

The wafers 110 are positioned as close to the LED lamp 120 as possible. Generally, during heating, the wafer 110 is positioned away from the cold plate 130 at least 50% of the gap 125 between the cold plate 130 and the LED lamps 120. For example, if the LED lamps 120 and cold plate 130 are positioned so that the gap 125 is about 20 mm, then during heating, the wafer 110 will be elevated at least 10 mm above the cold plate 130. The gap 125 between the cold plate 130 and LED lamp 120 is up to about 50 mm. In some embodiments, the gap 125 is in the range of about 1 to about 20 mm, or in the range of about 2 to about 15 mm. In some embodiments the wafer 110 is moved to a distance from the heater that is less than about 5 mm, 4 mm, 3 mm, 2 mm or 1 mm.

Figure 6:
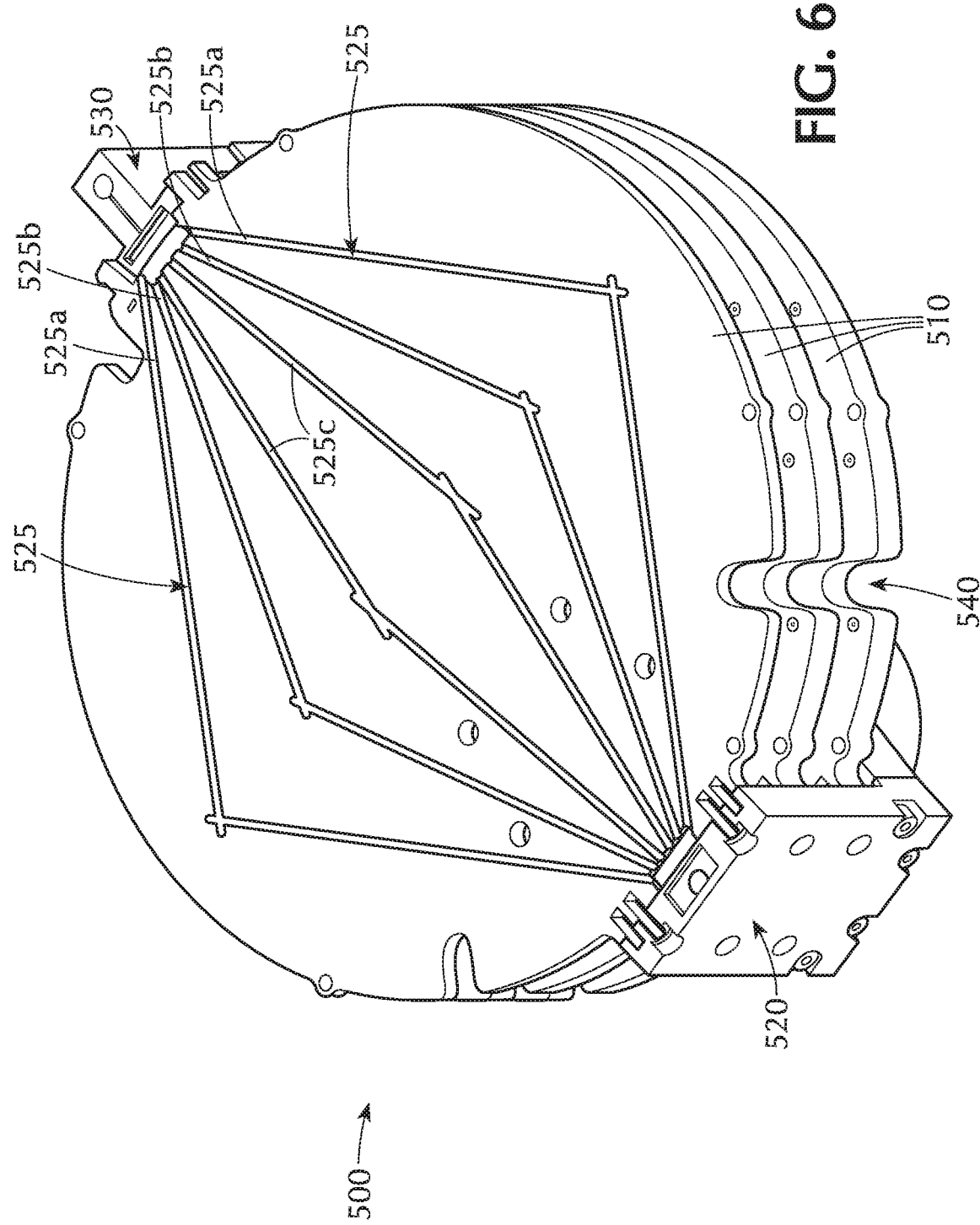
FIG. 6 is a perspective view of a wafer cassette according to one or more embodiment of the disclosure.

The wafers 110 can be held off of the cold plate 130 and preheated by the LED lamps 120 during the pump cycle of the loadlock chamber while waiting for vacuum transfers. As the wafers 110 are exchanged, the LED lamps 120 are turned off and the heat is removed by the heat exchanger 160 from the pedestal. In one embodiment, the heat exchanger 160 flows water (or other fluid) through channels in the walls 105 of the cassette 100 and through channels 525 in the cold plates 130 (or pedestals 510) as shown in FIG. 6. The contact between the back side 121 of the LED lamps 120 and the back side 131 of the cold plate cools the LED lamps 120 and the wafer 110.

After processing, the wafer 110 is loaded back into the cassette 100. The wafers 110 are placed on the cold plate 130 and are cooled during the venting process. Once the wafer 110 is exchanged by the factory interface the LED lamps 120 can begin to heat the wafers 110 again.

In some embodiments, each cold plate 130 is larger than the diameter of the substrate. For example, a cassette 100 for 300 mm wafers might have cold plate 130 that are about 320 mm in diameter. In some embodiments, the cold plate 130 is square with a length and width of about 320 mm.

The embodiment shown in FIG. 1 provides parallel pre- and post-processing that does not affect the original throughput of the system. Additionally, thermal shock while heating and cooling the wafer can be reduced. The LED lamps 120 can ramp the wafer 110 temperature instead of placing them directly on a hot plate and the wafer will cool down with the cold plates 130 as the heat is removed from the system.

Figure 2:
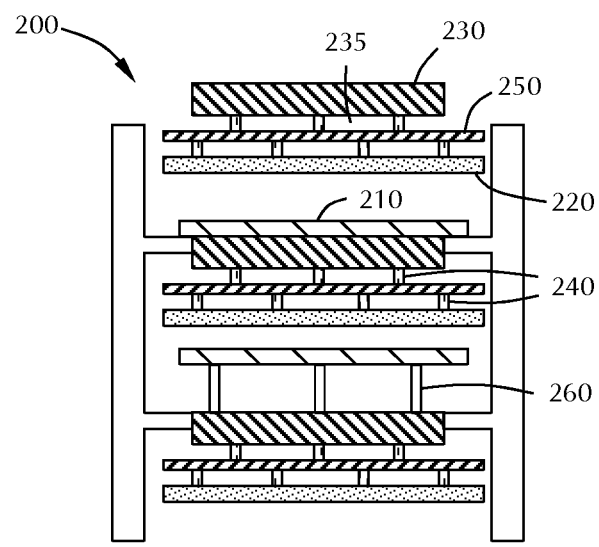
FIG. 2 is a cross-sectional view of a wafer cassette according to one or more embodiment of the disclosure.

FIGS. 2 through 4 show other aspects of the disclosure incorporating resistive heating and pedestal cooling with thermal breaks. Here, thick film resistive heating pedestals and cold pedestals are stacked with thermal breaks 240 between the two pedestals. The thermal breaks 240 can be, for example, heat shields like reflectors 250 (shown in FIG. 2) with vacuum gaps 235, evacuated vacuum regions 335 (shown in FIG. 3), or a low-thermal conductivity material 440 (shown in FIG. 4). The thermal break reduces the amount of heater energy that radiates to the cooling pedestals in the loadlock.

Each of the embodiments shown in FIGS. 2 through 4 operates in a similar manner as that of FIG. 1. The main difference between FIG. 1 and FIGS. 2 through 4 is the heater. The LED lamps 120 in FIG. 1 are replaced with resistive heaters 220, 320, 420 in FIGS. 2 through 4, respectively.

Referring to FIG. 2, the thermal breaks 240 provide separation between the heater 220, reflector 250 and cold plate 230. The reflector 250 is positioned adjacent to and spaced from the cold plate 230 by at least one thermal break 240. The heater 220 is positioned adjacent to and spaced from the reflector 250 by at least one thermal break 240. During pump down, the thermal breaks 240 allow gas between the heater 220, reflector 250 and cold plate 230 to be evacuated from the cassette 200 reducing the pressure between the components. Heat transfer by convection is reduced at low pressure so there is less impact on the cold plate 230 from the heater 220. Additionally, the reflector 250 provides another barrier between the heater 220 and the cold plate 230. There can be any suitable number of thermal breaks 240 depending on, for example, the size of the components being separated.

FIG. 3 shows another embodiment and method to insulate the stacked cold plate 330 and heater 320. Here, a vacuum region 335 having a partial vacuum is formed between the cold plate 330 and the heater 320 with an adequate gap to reduce heat transfer between the two plates. A "partial vacuum" used in this regard means an area of reduced pressure that acts as a barrier to convection. This would allow wafer heating and cooling to occur at higher pressures where convection has a greater impact on the process.

In FIG. 3, the heater 320 and cold plate 330 are shown in contact near the edges 350. To minimize the effect of convection, the heater 320 and cold plate 330 may be connected using an insulator 340. For example, a low conductivity adhesive or other low thermal conductivity material can be placed between the cold plate 330 and the heater 320 to prevent heat transfer between the units. This may also be referred to as a thermal gasket. In the embodiment shown in FIGS. 4 and 5, a low thermal conductivity material 440 is used as insulator between the heater 420 and the cold plate 430.

The embodiments shown in FIGS. 2 through 5 can be retrofit into an existing loadlock chamber or can be separate cassettes. In use, the wafer 210, 310, 410 is moved by the wafer lift pins 260, 360, 460 to close proximity to the heater 220, 320, 420 above. Preheating of the wafers 210, 310, 410 is done without contacting the heater 220, 320, 420 with the front side of the wafer 210, 310, 410. The exiting wafers 210, 310, 410 are placed on the cold plate 230, 330, 430 before exiting the system. Similar to that of FIG. 1, the embodiments of FIGS. 2 through 5 provide heating and cooling in parallel with other processes so that throughput is not significantly adversely affected by the addition of the pre heat and post cool processes.

The embodiments shown in FIGS. 2 through 4 have individually controlled lift pins 260, 360, 460 which can lift or lower any single or group of wafers in the cassette. The lift pins and controls to lift and lower the pins occupy space in the cassette and some embodiments do not use lift pins. In some embodiments, as shown in FIG. 5, a wafer lift 470 is used to move all of the wafers at one time. Use of a single wafer lift 470 may occupy less space than individual lift pins. The embodiment shown in FIG. 5 is identical in all respect to that of FIG. 4 with the exception of the lift mechanism. Where FIG. 4 allows independent lift pins to lift a single wafer, FIG. 5 uses a single wafer lift that can move all wafers together. The single wafer lift can move all of the wafers from the lower cooling position to the raised heating position (shown) with little effort.

The wafer lift is positioned to support a periphery 472 of a wafer 410. The wafer lift 470 can be made from any suitable material that can safely contact the wafer. The wafer lift 470 can move the wafers from a position adjacent the cold plate 430 to a position closer to the heater 420. The wafer lift can move the wafers simultaneously away from the front side of the cold plates by a distance of at least 50% of the gap.

Another aspect of the disclosure is directed to dual high temperature/low temperature fluid pedestal cassettes. Current cooling pedestals are designed with water channels to exchange heat with a low temperature fluid as the wafer is cooled from process temperature. The inventors have found that the thermal mass of the pedestals allows for quick heat with the fluid is quickly heated or simply replaced with a hot fluid.

FIG. 6 shows an embodiment of a pedestal cassette 500 in accordance with one or more embodiments of the disclosure. The cassette 500 shown in FIG. 6 does not have the heaters for descriptive purposes. One skilled in the art will understand that the cassette 500 can have any of the heaters shown in the various embodiments. The cassette 500 is shown with three pedestals 510 which can support one or more wafers (not shown). The pedestals 510 are connected to and in fluid communication with a supply manifold 520 and a return manifold 530. Fluid channels 525 extend through each of the pedestals 510 and form a fluid connection between the supply manifold 520 and the return manifold 530. The top pedestal 510 in FIG. 6 is shown cut in half to show the fluid channels 525 for descriptive purposes. Generally, the fluid channels 525 are enclosed within the body of the pedestals 510. The pedestals 510 in FIG. 6 each have a plurality of notches 540 that can be used by, for example, a robot to position wafers on the pedestals.

Each pedestal 510 can be sized to support any substrate. In some embodiments, each pedestal 510 is sized to support a 300 mm wafer. The number of pedestals 510 can range from 1 to any number that will fit in the space. For example, a cassette 500 might be positioned within a loadlock. The size of the loadlock will limit the maximum number of pedestals 510 based on the pedestal-pedestal pitch and size of the components. In some embodiments, there are is a multiple of six pedestals 510, for example, 12, 18 or 24 pedestals.

In use, a fluid source (not shown) is connected to the supply manifold 520 and the return manifold 530. The fluid source can be any suitable fluid source including, but not limited to, a cold water reservoir or recirculator, a hot water reservoir or recirculator, a heated and/or cooled gas cylinder or a source providing a fluid with a different heat capacity than water. Fluid from the fluid source flows into the supply manifold 520 where the flow is split into multiple paths within the manifold. There is at least one path for each pedestal 510. In the embodiment shown in FIG. 6, each pedestal has six separate fluid channels 525. However, this is just one possible configuration and should not be taken as limiting the scope of the disclosure. In some embodiments, each pedestal, independently, comprises at least one, two, three, four, five, six, seven, eight, nine, 10, 11, 12, 13, 14, 15, 16 or more fluid channels 525.

The length of any fluid channel 525 depends on the path followed. For example a straight channel connecting the supply manifold 520 with the return manifold 530 would have a shorter length than a fluid channel that curves around the periphery of the pedestal 510. The embodiment shown in FIG. 6 has six fluid channels 525 with three sets of channels with about the same length. Both of channels 525a have about the same length, both of channels 525b have about the same length and both of channels 525c have about the same length. Each of the fluid channels 525 can have a different length than any of the other channels.

The diameter of the fluid channels 525 can be changed to affect for example, the flow rate through the channel or balance the flow rates through multiple channels. In some embodiments, all of the fluid channels 525 in a pedestal 510 have the same diameter. In one or more embodiment, each of the fluid channels 525 has a diameter independent from any of the other fluid channels 525 in the pedestal 510. In some embodiments the diameter of the fluid channel 525 increases as the length of the fluid channel 525 increases. In FIG. 6, for example, the diameter of channels 525a might be larger than the diameter of channels 525b which might be larger than channels 525c.

Fluid from the supply manifold 520 flows through the fluid channels 525 in the pedestals 510 toward the return manifold 530. At the return manifold 530, the fluids from the individual channels 525 and pedestals 510 are combined and flow to, for example, a waste line or a recirculation system.

The current heat exchanger systems have a large thermal mass of fluid held at a specific temperature that could be used to rapidly cool and heat the aluminum pedestals 510 inside the loadlock. The thermal mass of the fluid in each system is about one order of magnitude larger than the thermal mass of the pedestals.

Figure 7:
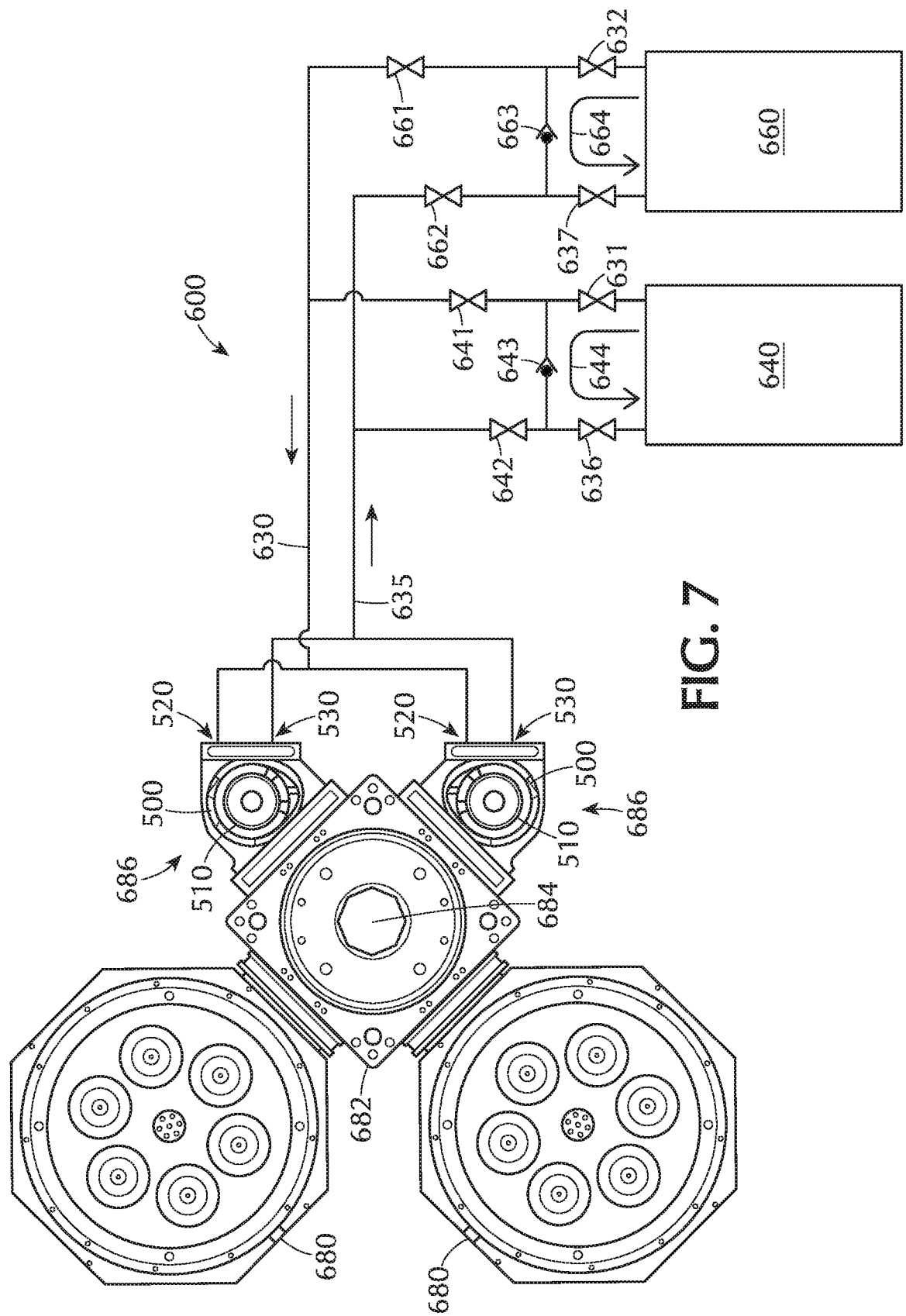
FIG. 7 shows a schematic of a system for heating and cooling the wafer cassettes according to one or more embodiments of the invention.

FIG. 7 shows a heat exchanger system 600 in accordance with one or more embodiments of the disclosure. Two processing chambers 680 are connected to a central transfer station 682 which has at least one robot 684 within. Although two are shown, at least one loadlock 686 is positioned on a front end of the transfer station 682 and serve as a factory interface (FI) to allow transfer of wafers from outside to inside the processing system. A cassette 500 is shown within each of the loadlocks 686. The cassette 500 could be replaced with any of the cassette embodiments described or can be an integral part of the loadlock. As an integral part of the loadlock, the cassette wall would be the same as the loadlock wall.

An inlet line 630 extends from a heating system 640 and a cooling system 660 toward the loadlock 686. The inlet line 630 is in fluid communication with the supply manifold 520 of each cassette 500. The inlet line 630 is also in fluid communication with an inlet line heater connection 631 and an inlet line cooler connection 632. The inlet line heater connection 631 and the inlet line cooler connection 632 are any suitable connection component that allows separation. For example, the inlet line heater connection 630 and/or the inlet line cooler connection 632 may be valves that can be closed to isolate the inlet line 630. An outlet line 635 is in fluid communication with the return manifold 530 on each cassette 500. The outlet line 635 is also in fluid communication with an outlet line heater connection 636 and an outlet line cooler connection 637. Like the inlet line connections, the outlet line heater connection 636 and outlet line cooler connection 637 can be any suitable component that allows separation. For example, the outlet line heater connection 636 and/or outlet line cooler connection 637 can be a valve that can be closed to isolate the outlet line 635.

During the factory interface (FI) transfer, a heating system 640 uses high temperature fluid to heat the pedestals 510 to a predetermined temperature (e.g., up to 300° C.). During the pump down to base pressure and transfer pressure the wafers would be heated on the pedestals 510 with the hot fluid running through the system. During the vacuum transfers the pedestals 510 would remain hot until the last wafer is transferred to the process chamber or removed from the loadlock 686.

To provide heating fluid, the heating system 640 is connected to an inlet manifold 520 on each of the cassettes 500. A flow of heating fluid leaves the heating system 640 and passes through open valve 641 to the inlet manifold 520. After passing through the pedestals 510 and into the outlet manifold 530, the fluid flow back to the heating system 640 through open valve 642. During this cycle, bypass valve 643 is closed to prevent flow of fluid through the bypass loop 644.

To prevent mixing, the cooling system 660 can be isolated. Valve 661 and valve 662 are turned off to stop flow out of and into the cooling system 660. A cooler bypass loop 664 is in fluid communication with the inlet line cooler connection 632 and the outlet line cooler connection 637. The cooler bypass loop 664 may include a cooler bypass valve 663 that can be opened so that fluid within the cooling system 660 can continue to circulate through bypass loop 664 in preparation for cooling operations.

Similarly, to prevent mixing, the heating system 640 can be isolated. Valve with the a heater bypass loop in fluid communication with the inlet line heater connection and the outlet line heater connection, the heater bypass loop comprising a bypass valve to allow a fluid to flow between the inlet line and the outlet line; and Once all of the wafers have been removed from pedestals 510, the cooling system 660 can be engaged. To engage the cooling system 660 and prevent mixing with the heating system 640, the heating system can be isolated. A heater bypass loop 644 is in fluid communication with the inlet line heater connection 631 and the outlet line heater connection 636. The heater bypass loop 644 may also have a heater bypass valve 643 to allow fluid to circulate in the heater lines. To isolate the heating system 640, valve 641 and valve 642 are closed and bypass valve 643 is opened to allow the heating fluid to circulate through the bypass look 644. Bypass valve 663 on the cooling system 660 can be closed to prevent further flow through the bypass loop 664. Valve 661 and valve 662 are opened to allow a flow of fluid from the cooling system 660 toward the inlet manifold 520 and through the pedestals 510 in the cassette 500. At this point the hot fluid system could be diverted away from the pedestals 510 and the fluid in the cooling system 660 would push the hot fluid out of the pedestals 510, rapidly cooling the pedestals 510 with the wafers to the predetermined temperature.

Once the cooling temperature is met, the wafers can be lifted off of the cold plates. Once the wafers are done cooling the cooling system 660 would be diverted away from the cassettes 500 and the valves will be changed so that the heating system 640 can heat the pedestals 510 again.

The configuration shown in FIG. 7 provides parallel pre- and post-processing that does not affect the original designed throughput of the system. Thermal shock while heating and the cooling the wafer will be reduced because the wafers heat and cool with the base pedestal materials. Embodiments of the disclosure allow the smallest loadlock volume design that will improve throughput compared to the other concepts. The configuration of FIG. 7 shows an exemplary heating/cooling circulation system in accordance with one or more embodiments of the disclosure. The heating/cooling circulation system can be used with any of the wafer cassettes described.

While the foregoing is directed to embodiments of the present disclosure, other and further embodiments of the disclosure may be devised without departing from the basic scope thereof, and the scope thereof is determined by the claims that follow.

What is claimed is:

1. A wafer cassette comprising:
    at least one wall supporting a plurality of cold plates, the at least one wall allowing access to a front side of at least some of the cold plates so that at least one wafer can be positioned adjacent the front side of the cold plates;
    a reflector adjacent a back side of at least some of the cold plates, the reflector separated from the back side of the cold plate by at least one thermal break contacting the reflector and the back side of the cold plate;
    a heater adjacent a back side of the reflector, the heater separated from the back side of the reflector by at least one thermal break contacting the heater and the back side of the reflector so that there is a gap between a back side of the heater and the front side of an adjacent cold plate; and
    a plurality of lift pins positioned within the front side of at least some of the cold plates, the plurality of lift pins configured to support any or all of the at least one wafer, and the plurality of lift pins configured to be moved at the same time or independently so that all of the wafers move at the same time or to allow individual control of the movement of at least one wafer.

2. The wafer cassette of claim 1, wherein each of the plurality of cold plates comprises at least one fluid channel through a body of the cold plate.

3. The wafer cassette of claim 2, wherein the at least one wall comprises a supply manifold in fluid communication with the fluid channels in the body of the cold plate.

4. The wafer cassette of claim 3, wherein the at least one wall further comprises a return manifold in fluid communication with the fluid channels in the body of the cold plate.

5. The wafer cassette of claim 1, wherein the gap between the front side of the cold plate and the back side of the heater is in the range of about 2 mm to about 50 mm.

6. The wafer cassette of claim 1, wherein the heater is a resistive heater.

7. The wafer cassette of claim 1, wherein the lift pins have a length sufficient to move a wafer away from the front side of the cold plates by a distance of at least 50% of the gap.

* * * * *